United States Patent
Ho et al.

(10) Patent No.: US 6,607,023 B2
(45) Date of Patent: Aug. 19, 2003

(54) STRUCTURE FOR ASSEMBLING A HEAT SINK ASSEMBLY

(75) Inventors: Ping Tsang Ho, Shinjuang (TW); Tsai Ching Feng, Taipei (TW)

(73) Assignee: Datech Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 10/115,008
(22) Filed: Apr. 4, 2002

(65) Prior Publication Data
US 2003/0116304 A1 Jun. 26, 2003

(30) Foreign Application Priority Data
Dec. 20, 2001 (TW) .................. 90222443 U

(51) Int. Cl.$^7$ .................. H05K 7/20
(52) U.S. Cl. .................. 165/78; 165/80.3; 165/185; 174/16.3; 257/722; 361/704
(58) Field of Search .................. 165/80.3, 78, 182, 165/185; 174/16.3; 257/722; 361/704

(56) References Cited

U.S. PATENT DOCUMENTS

| | | | |
|---|---|---|---|
| 2,434,676 A | * | 1/1948 | Spender .................. 165/182 |
| 5,558,155 A | * | 9/1996 | Ito .................. 165/80.3 |
| 6,104,609 A | * | 8/2000 | Chen .................. 361/704 |
| 6,336,498 B1 | * | 1/2002 | Wei .................. 165/80.3 |
| 6,340,056 B1 | * | 1/2002 | Huang et al. .................. 165/185 |
| 6,382,307 B1 | * | 5/2002 | Wang et al. .................. 165/80.3 |
| 6,449,160 B1 | * | 9/2002 | Tsai .................. 361/704 |
| 6,474,407 B1 | * | 11/2002 | Chang et al. .................. 165/80.3 |

\* cited by examiner

*Primary Examiner*—Leonard R Leo
(74) *Attorney, Agent, or Firm*—Troxell Law Office PLLC

(57) ABSTRACT

A structure for assembling a heat sink assembly uses at least an interlocking device to assemble at lease a heat sink fin. The improvement in the interlocking devices comprises a female slot, a protruding hook, and an opening hole. Said protruding hook of each first heat sink fin wedges into said female slot of an adjacent first heat sink fin by the shape of said protruding hook corresponding to said female slot, and said protruding hook of each first heat sink fin having a barb portion for hooking into said opening hole of said adjacent first heat sink fin for interlocking completely in the vertical direction. Besides, the protruding hook further includes a protruding portion, said protruding portion having a T-shaped cross-section configuration is correspondingly equal to said female slot for interlocking completely in the horizontal direction. Therefore, the heat sink assembly provided by the present invention may be interlocked in both horizontal and vertical direction.

6 Claims, 6 Drawing Sheets

STRUCTURE FOR ASSEMBLING A HEAT SINK ASSEMBLY

FIELD OF THE INVENTION

The invention herein relates to a structure for assembling a heat sink assembly for CPU dissipation, more specifically, to an improved heat sink assembly structure with interlocking devices for the assembling structure being interlocked in both horizontal and vertical direction.

BACKGROUND OF THE INVENTION

Due to the continuous development of computer technology and the enhancement of integrated circuit production technology, CPU execution speeds are always increasing. Thus, the amount of heat generated rises in direct proportion. If the rate of CPU heat dissipation is insufficient, the computer operating stability will be affected. As a result, the most direct and easy solution for solving the problem of CPU overheating is to use a heat sink assembly to dissipate the high temperature produced by the CPU.

The conventional heat sink currently available has two mainly type. As shown in FIG. 1A, which is constructed of a single piece of extruded aluminum with a plurality of heat sink fins 1a and a base plate 1b. Due to the limitations of mold removal and extrusion technology, the heat sink fins 1a are thicker, which not only results in a larger area of dissipating inefficiency, but also a slower rate of heat conduction and. Furthermore, since the distance d between the heat sink fins is overly large, the number of heat sink fins 1a is less, and the overall heat dissipation area is small, there is another negative effect on the rate of heat dissipation by the heat sink. Besides, the procedure of aluminum extrusion finishing process is complex, and resulting not only in slowing down the fabrication speed, but also wasting material consumption when cutting and shaving.

Also available on the current market is a structure of assembling heat sink, as shown in the U.S. Pat. No. : 6,104,609, please referring to the FIG. 1B, which interlocks the heat sinks 1 by a hook 11 and a female interlocking slot 12 thereon. However, this structure of interlocking device 10 only provides for interlocking in the horizontal direction. As a result, the heat sink assembly may fall off in the vertical direction when assembling due to the lacking means for interlocking in the vertical direction.

In view of the various disadvantages of conventional heat dissipation devices in terms of heat sink design structure, the present invention addresses the disadvantages by researching solutions for them which, following continuous research and improvements, culminated in the development of the improved structure for assembling a heat sink assembly of the invention herein, a structure capable of eliminating the numerous drawbacks of the conventional technology.

SUMMARY OF THE INVENTION

The present invention provides a structure for assembling a heat sink assembly using at least an interlocking device to assemble at lease a heat sink fin, the improvement of said interlocking device comprising a female slot, a protruding hook, and an opening hole, wherein said protruding hook of each first heat sink fin wedges into said female slot of an adjacent first heat sink fin by the shape of said protruding hook corresponding to said female slot, and said protruding hook of each first heat sink fin having a barb portion for hooking said opening hole of said adjacent first heat sink fin to assemble said heat sink fins for interlocking completely in the vertical direction.

DESCRIPTION OF THE PREFERRED EMBODIMENTS

The following descriptions of the preferred embodiments are provided to understand the features and the structures of the present invention.

Figure 1A:
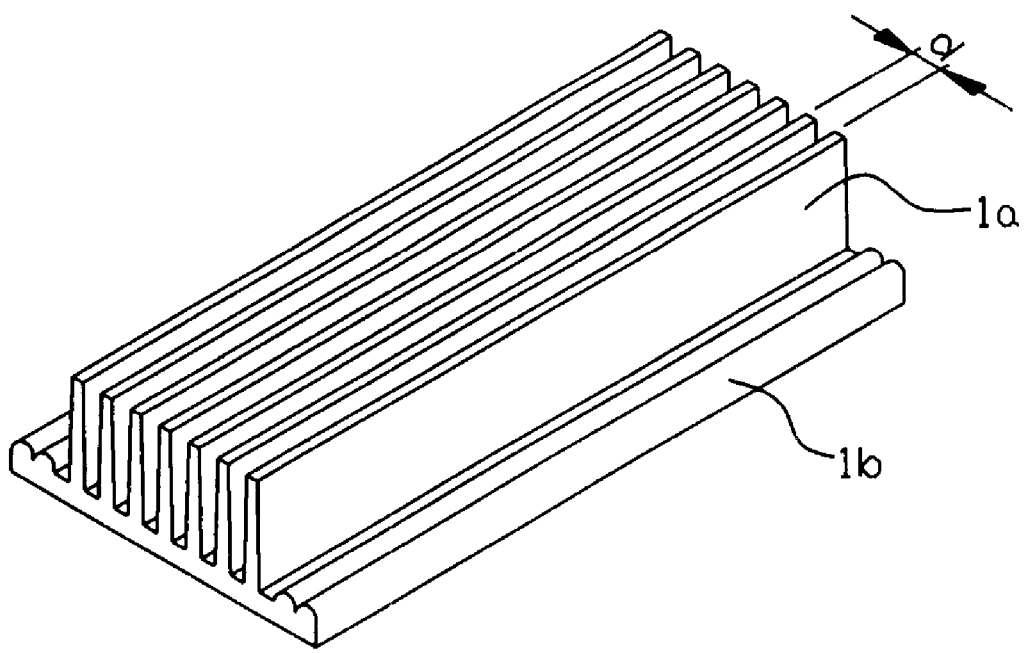
FIG. 1A is an exploded perspective view of a conventional structure of heat sink.
Figure 1B:
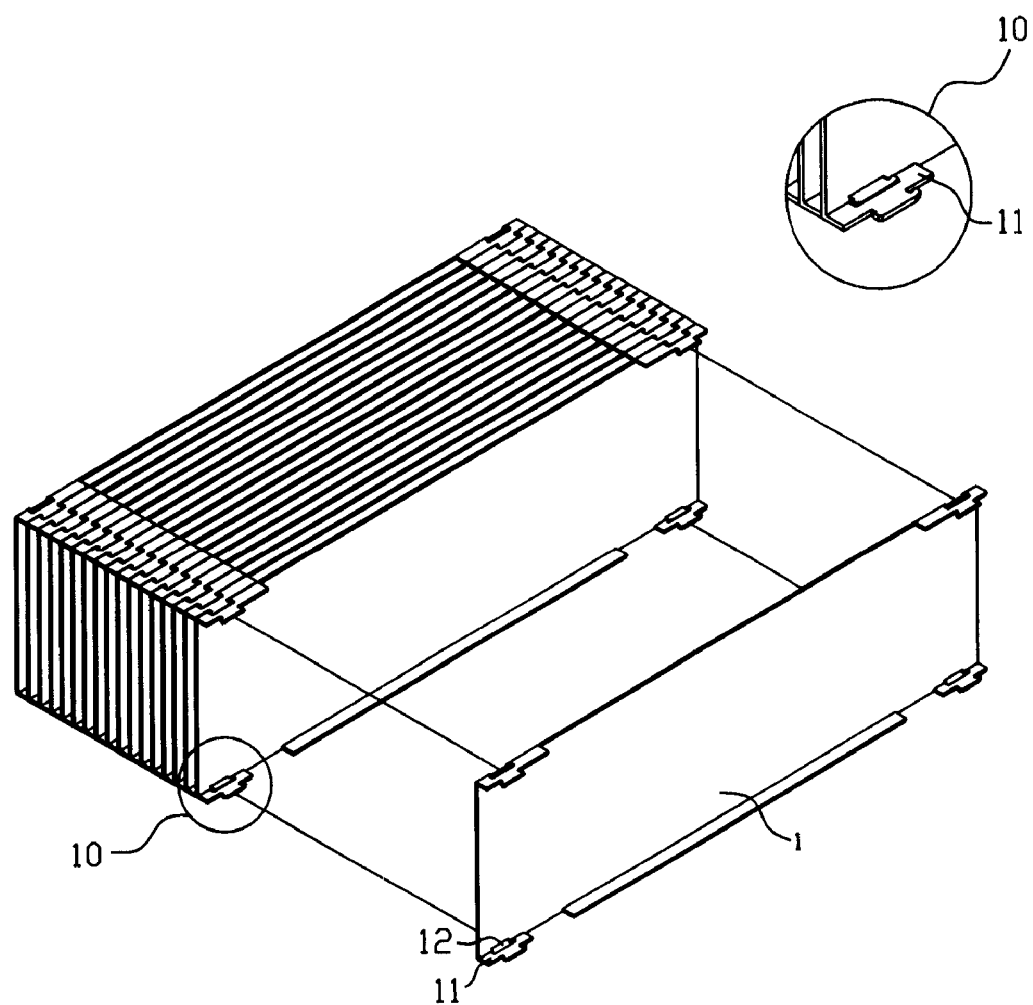
FIG. 1B is an exploded perspective view of a conventional structure for assembling a heat sink assembly.
Figure 2:
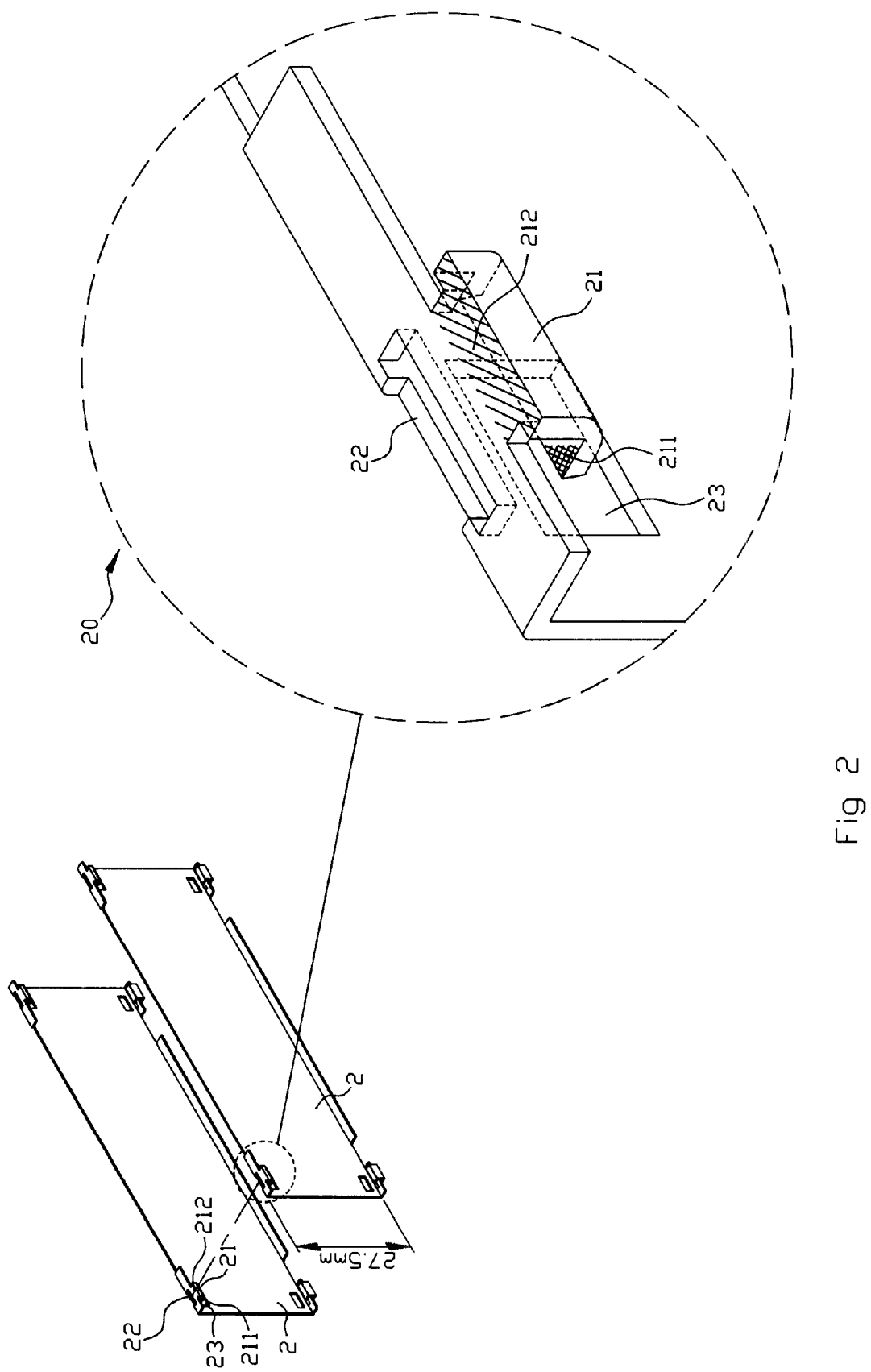
FIG. 2 is an enlarged perspective view of the present invention.
Figure 3A:
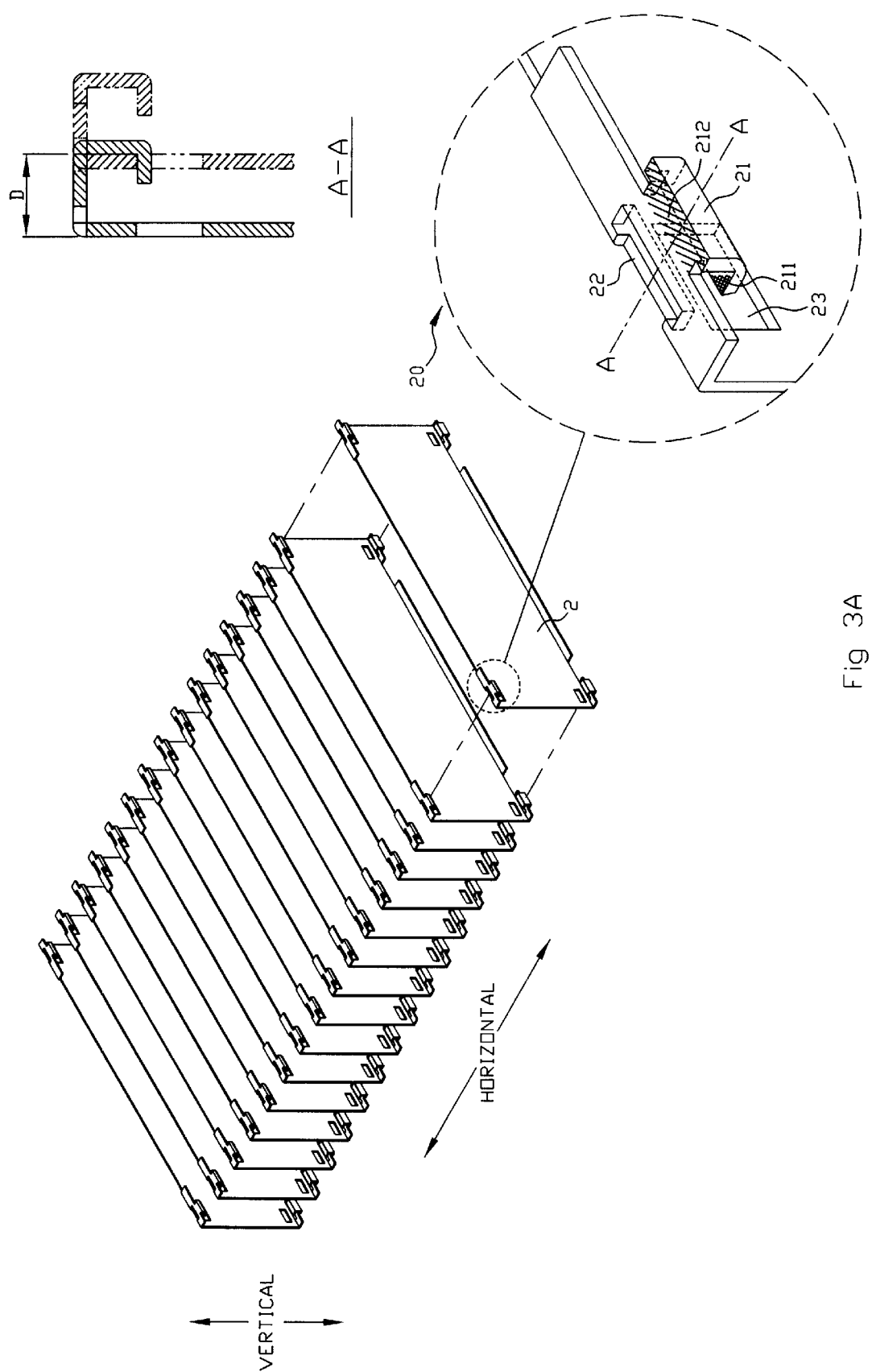
FIGS. 3A and 3B are exploded perspective views of structure for assembling a heat sink assembly in accordance with the present invention.
Figure 3B:
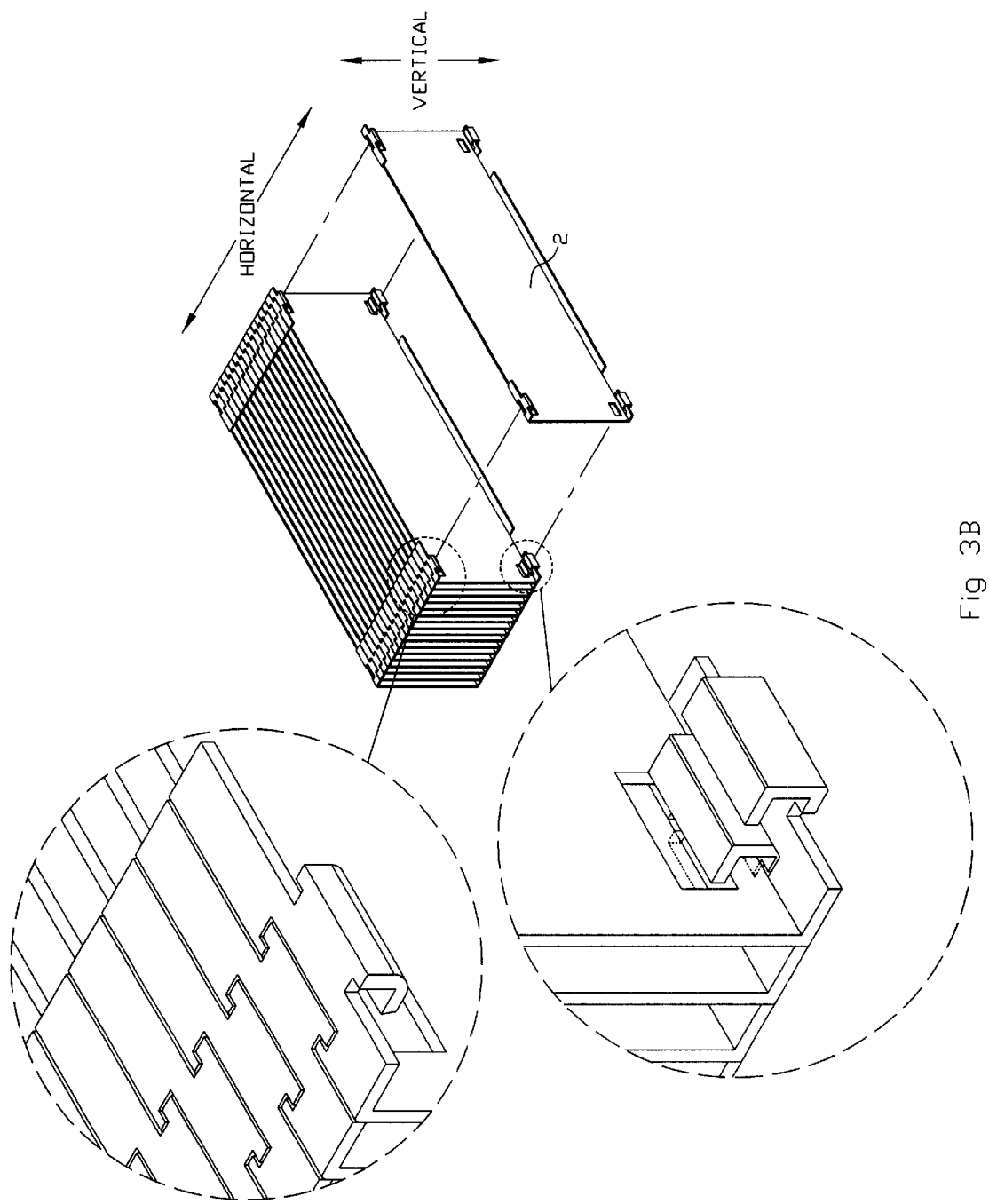

Referring to the FIG. 2, the present invention provides an improved structure for assembling a heat sink assembly using at least an interlocking device 20 to assemble at lease a heat sink fin 2 for dissipating the heat generated from CPU (please referring to the FIG. 3B for the result of after assembling). The improvement herein of the interlocking device 20 comprises a female slot 22, a protruding hook 21, and an opening hole 23 for assembling said heat sink fins 2, wherein said protruding hook 21 of each first heat sink fin 2 wedges into said female slot 22 of an adjacent first heat sink fin 2 by the shape of said protruding hook 21 corresponding to said female slot 22. And furthermore, the protruding hook 21 has a barb 211 for hooking said opening hole 23 of said adjacent first heat sink fin 2 to assemble said heat sink fins 2 for interlocking completely in the vertical direction. Additionally, the protruding hook 21 includes an protruding portion 212 having a T-shaped cross-section configuration (the FIG. 3B will be more clearly for the top view of the assembly) correspondingly equal to said female slot 22, thus, when assembling the heat sink fins, the present invention can be provided for interlocking completely in the horizontal direction. Therefore, if there is any vibration in the horizontal direction when assembling, the heat sink assembly will not fall off. And moreover, the present invention will not fall off in the vertical direction by the barb portion 211 of the first heat sink fin 2 hooking into the opening hole 23 of the adjacent first heat sink fin, please referring to the FIG. 3B for completing the assembly. In one preferred embodiment, the width of the heat sink fin 2 provided by the present invention is equal to 27.5 mm.

Besides, the interlocking devices 20 are located in the upper and lower corners of said heat sink fins 2. However, as the person skilled in the art may modify the location of the interlocking devices upon reference to the present disclosure for interlocking in both horizontal and vertical direction, such as located in the center of the upper and lower edge of the heat sink fins for interlocking.

Figure 4:
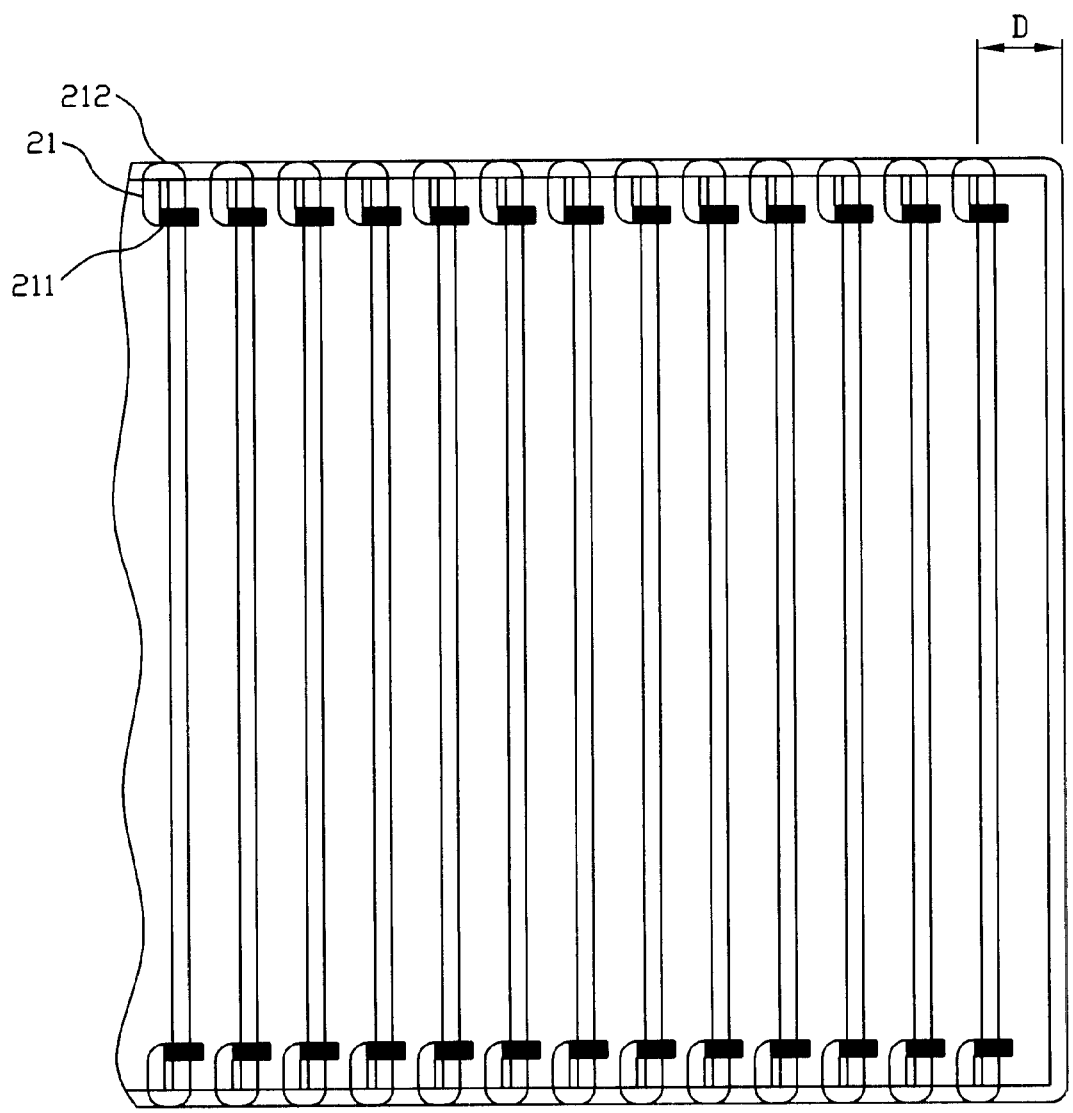
FIG. 4 is a side section view of the present invention after assembling.

Referring to the side section view of the present invention, after assembling, in FIG. 4, the heat sink assembly further includes a specific space D between each first heat sink fin and the adjacent first heat sink fin. Furthermore, the width D of the specific space is substantially smaller than 2 mm. Because the thickness of the heat sink fin is thinner than the conventional heat sink, there are more heat sink fin 2 may be provided for assembling, and forming a bigger area for dissipating the heat. As such, the improved structure of the invention herein increases the performance and accelerates the rate of heat dissipation, allowing the central processing unit to function under optimal operating temperature conditions for the duration of operation and, furthermore, offers additional computer utilization stability.

The present invention may be embodied in other specific forms without departing from the spirit of the essential attributes thereof; therefore, the illustrated embodiment should be considered in all respects as illustrative and not restrictive, reference being made to the appended claims rather than to the foregoing description to indicate the scope of the invention.

What is claimed is:

1. A structure for assembling a heat sink assembly using at least an interlocking device to assemble at least a heat sink fin, the improvement of said interlocking device comprising:

a female slot;

a protruding hook for wedging into said female slot; and an opening hole for being hooked by a barb portion;

wherein said protruding hook of each first heat sink fin wedges into said female slot of an adjacent first heat sink fin by the shape of said protruding hook corresponding to said female slot, and said protruding hook of each first heat sink fin having said barb portion for hooking into said opening hole of said adjacent first heat sink fin to assemble said heat sink fins for interlocking completely in a vertical direction.

2. The structure for assembling a heat sink assembly of claim 1, wherein said interlocking devices are located on the upper and lower corners of said heat sink fins.

3. The structure for assembling a heat sink assembly of claim 1, wherein said heat sink assembly further includes a specific space between each first heat sink fin and the adjacent first heat sink fin by interlocking said interlocking devices.

4. The structure for assembling a heat sink assembly of claim 1, wherein said protruding hook further includes an protruding portion, wherein said protruding portion having a T-shaped cross-section configuration corresponds equally to said female slot for interlocking completely in a horizontal direction.

5. The structure for assembling a heat sink assembly of claim 3, the width of said heat sink fin is substantially equal to 27.5 mm.

6. The structure for assembling a heat sink assembly of claim 3, wherein said specific space is substantially smaller than 2 mm.

* * * * *